United States Patent
Gerber et al.

(10) Patent No.: US 7,525,394 B2
(45) Date of Patent: Apr. 28, 2009

(54) ULTRA LOW POWER CMOS OSCILLATOR FOR LOW FREQUENCY CLOCK GENERATION

(75) Inventors: Johannes Gerber, Unterschleissheim (DE); Santiago Iriarte Garcia, Munich (DE)

(73) Assignee: Texas Instruments Incorporated, Dallas, TX (US)

( * ) Notice: Subject to any disclaimer, the term of this patent is extended or adjusted under 35 U.S.C. 154(b) by 169 days.

(21) Appl. No.: 11/618,218

(22) Filed: Dec. 29, 2006

(65) Prior Publication Data
US 2007/0188250 A1 Aug. 16, 2007

(30) Foreign Application Priority Data
Sep. 30, 2005 (DE) ............ 10 2005 047 030
Aug. 31, 2006 (DE) ............ 10 2006 040 832

(51) Int. Cl.
*H03K 3/06* (2006.01)
*H03K 3/26* (2006.01)

(52) U.S. Cl. ............ 331/143; 331/111; 331/36 C; 327/182; 327/207; 327/438; 327/214

(58) Field of Classification Search ............ 327/182, 327/191, 207, 397, 428, 429, 438, 440, 441, 327/445, 453, 460, 461, 468, 582, 78, 214, 327/439, 538; 329/36, 111, 302; 330/137; 331/36, 111, 143, 36 C
See application file for complete search history.

(56) References Cited

U.S. PATENT DOCUMENTS

| 3,660,687 | A * | 5/1972 | Sahm et al. | 327/439 |
| 3,902,079 | A * | 8/1975 | Ahmed | 327/214 |
| 5,206,542 | A * | 4/1993 | Nakao | 327/78 |
| 5,512,855 | A * | 4/1996 | Kimura | 327/538 |
| 5,532,653 | A * | 7/1996 | Adkins | 331/143 |
| 6,147,566 | A * | 11/2000 | Pizzuto et al. | 331/111 |
| 6,362,697 | B1 * | 3/2002 | Pulvirenti | 331/111 |
| 6,784,704 | B2 * | 8/2004 | Sato | 327/143 |
| 7,167,060 | B2 * | 1/2007 | Cho et al. | 331/143 |
| 2007/0279137 | A1 * | 12/2007 | Molina | 331/111 |

\* cited by examiner

*Primary Examiner*—Lun-Yi Lao
*Assistant Examiner*—Richard Tan
(74) *Attorney, Agent, or Firm*—Mirna Abyad; Wade J. Brady, III; Frederick J. Telecky, Jr.

(57) ABSTRACT

An ultra low power relaxation CMOS oscillator for low frequency clock generation comprises a current source and a pair of capacitors that are alternatingly charged by the current source and discharged by thyristor-based inverters being used as comparators. No separate bias currents are needed.

10 Claims, 1 Drawing Sheet

ULTRA LOW POWER CMOS OSCILLATOR FOR LOW FREQUENCY CLOCK GENERATION

The present invention relates to an ultra low power CMOS oscillator for low frequency clock generation. In the context of this application, the term "low frequency" means a range from 10 to 50 kHz, and "ultra low power" means a current consumption of less than 500 nA.

BACKGROUND

Ultra low power oscillators for low frequency clock generation are currently not available. There is a need for such oscillators.

SUMMARY

The invention provides an ultra low power CMOS oscillator for low frequency clock generation. The oscillator comprises a current source and a pair of capacitors that are alternatingly charged by the current source and discharged by a MOS thyristor-based inverter used as a comparator. A MOS thyristor-based inverter does not need any bias current since it uses the inherent threshold voltage of the process for comparison. Accordingly, only the reference current is needed, and power consumption is reduced to a minimum.

In a preferred embodiment, the thyristor-based inverters each have a pair of complementary MOS transistors. A first one of the MOS transistors has a gate forming the input of the inverter, a source connected to a reference supply terminal and a drain forming the output of the inverter. A second one of the MOS transistors has a source connected to a supply terminal, a drain connected to the gate of the first MOS transistor and a gate connected to the output of the inverter. It is the threshold voltage of the first MOS transistor that determines the trigger point of the thyristor. By comparing the input voltage (i.e., the voltage to which the respective capacitor is charged) with the transistor threshold voltage, the thyristor-based inverter behaves like a comparator. Each thyristor-based inverter is enabled or disabled by selectively connecting or disconnecting the drain of the second MOS transistor with or from the gate of the first MOS transistor, and the gate of the second MOS transistor with or from the drain of the first MOS transistor. Sequencing of the oscillator is preferably achieved with two chained inverters which have an input connected to the output of one of the thyristor-based inverters, an interconnection node providing a switch control signal to one of the switch members and an output node providing a switch control signal to the other switching member. To avoid dynamic intermediate states of the oscillator, the preferred embodiment of the oscillator comprises a first delay element with an input connected to the output node and an output providing an enabling signal to a first one of the thyristor-based inverters and a second delay element with an input connected to the interconnection node and an output providing an enabling signal to a second one of the thyristor-based inverters.

In the preferred implementation, the reference current source is built with MOS transistors and provides a reference current proportional to the threshold voltage of the MOS transistors. Therefore, the reference current tracks the transistor threshold over temperature and process, whereby a stable output frequency is achieved.

BRIEF DESCRIPTION OF THE DRAWINGS

Further advantages and features of the invention will become apparent from the below description below of a preferred embodiment, and from the accompanying drawings, wherein.

DETAILED DESCRIPTION OF EXAMPLE EMBODIMENTS

Figure 1:
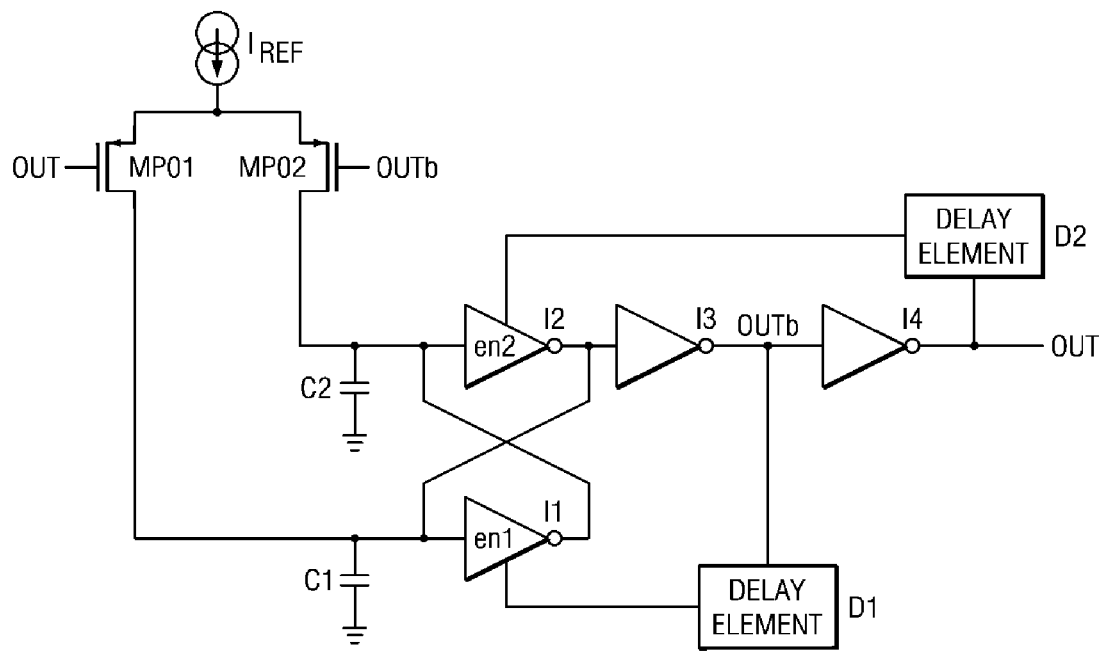
FIG. 1 is a circuit diagram of an ultra-low power CMOS oscillator for low frequency clock generation according to the invention.

FIG. 1 shows a CMOS oscillator circuit with a current source connected to the sources of two p-type MOS transistors, MP01 and MP02, respectively. The current source is operable to provide a reference current $I_{REF}$ to the source terminal of each of the transistors MP01 and MP02. The gates of the transistors MP01 and MP02 are operable to receive input voltage signals out and outb, respectively. The drain of the transistor MP01 is connected to one terminal of a capacitor C1 and the drain of the transistor MP02 is connected to one terminal of a capacitor C2. The other terminals of the capacitors C1 and C2 are connected to ground. The terminal of the capacitor C1 that is connected to transistor MP01 is also connected to the input of an inverter I1 and the output of an inverter I2. The terminal of the capacitor C2 that is connected to transistor MP02 is also connected to the input of inverter I2 and the output of inverter I1. The transistors MP01 and MP02 are operable to act as switching elements when enabled by gate voltages out and outb, respectively. However, the transistors MP01 and MP02 are configured to operate alternately; that is, when MP01 is ON (the signal out=1), MP02 is OFF (signal outb=0), and when MP01 is OFF (the signal out=0), MP02 is ON (signal outb=1).

The inverters I1 and I2 are MOS thyristor-based inverters; that is, they are implemented in MOS technology and require no bias current whatsoever. The output of the inverter I2 is connected to the input of an inverter I3, which forms part of a delay chain, with the output outb of the inverter I3 being connected to the input of the inverter I4.

The outputs of the inverters I3 and I4 are operable to provide output signals outb and out, respectively, and are connected to the input terminals of delay elements D1 and D2, respectively. The outputs of the delay elements D1 and D2 are respectively connected to the enablement terminals en1 and en2 of the inverters I1 and I2. The outputs of the delay elements D1 and D2 provide the enabling signals to the terminals en1 and en2 of the inverters I1 and I2. The outputs from the inverters I3 and I4 are also connected to the gates of the transistors MP01 and MP02, so that the transistors MP01 and MP02 are alternately switched by gate voltages outb and out, as discussed above. The delay elements D1 and D2 are provided between the outputs of the inverters I3 and I4 and the terminals en1 and en2 of the inverters I1 and I2, respectively, so as to avoid any dynamic intermediate states of the inverters I1 and I2. The delay elements D1 and D2 can each be formed by a simple inverter delay chain.

Figure 2:
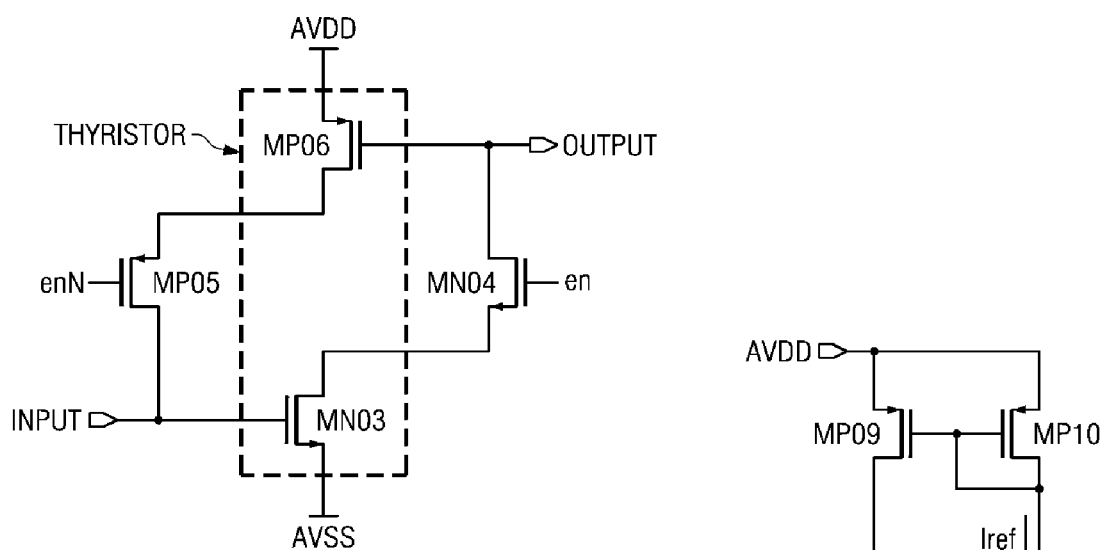
FIG. 2 is a circuit diagram of a thyristor based inverter for implementation in a CMOS oscillator according to the invention.

An example of a suitable structure for each of the MOS thyristor-based inverters I1 and I2 is shown schematically in FIG. 2. Each inverter is comprised of four MOS transistors. The input to the inverter is applied to the gate of an n-type transistor MN03. The source of the transistor MN03 is connected to a voltage rail AVSS and the drain of the transistor MN03 is connected to the source of an n-type transistor MN04. In addition to being connected to the input, the gate of the transistor MN03 is also connected to the drain of a p-type transistor MP05. The gate terminal of the transistor MN04 is the enablement terminal en of the thyristor-based inverter described above and is operable to receive the output signal from one of the delay elements D1 or D2. The gate of the transistor MP05 is operable to receive a signal enN which is a signal of opposite polarity to the signal en. The drain of the transistor MN04 is connected to the output terminal of the inverter and also to the gate of a p-type transistor MP06. The source of the transistor MP05 is connected to the drain of the transistor MP06. The source of the transistor MP06 is connected to a voltage rail AVDD.

The transistors MN03 and MP06 form the thyristor-based inverter itself, and the transistors MN04 and MP05 are operable to enable the inverter. In the enabled state of the inverter, the input signal to the gate of the transistor MN04 is high (en=1) and the input signal to the gate of the transistor MP05 is low (enN=0). When the inverter is in a disabled state the input signal to the gate of the transistor MN04 is low (en=0) and the input signal to the gate of the transistor MP05 is high (enN=1).

In operation, the reference current source $I_{REF}$ alternatingly charges the capacitors C1 and C2, and the MOS thyristor-based inverters I1, I2 are used as comparators to detect the voltage to which the capacitors are charged, and to discharge each capacitor as soon as the transistor threshold voltage is exceeded.

The thyristor-based inverters experience a certain delay since the reference current needs a certain time to raise the voltage at the capacitors above the threshold. Once this happens, the respective thyristor ignites and enables the other one. A delayed output signal "out_del" is used for this to avoid any dynamic currents. The output signal also redirects the reference current to the appropriate one of the capacitors C1, C2. The thyristor cell itself may have a configuration described for use as a delay line in Gyudong Kim, Min-Kyu Kim, Byoung-Soo Chang, and Wonchan Kim, "A Low-Voltage, Low-Power CMOS Delay Element," IEEE Journal of Solid-State Circuits, Volume 31, Issue 7, Jul. 1996, pages 966-971.

The oscillation frequency is found to be:

$$freq \cong \frac{I_{REF}}{V_{THN} \cdot 2C}.$$

So, for example, under the following assumptions a 16 kHz output frequency results:

$$\left. \begin{array}{l} I_{REF} \approx 20\text{nA} \\ VTHN \approx 0.5\text{V} \\ C \approx 1.25\text{pF} \end{array} \right\} \rightarrow freq \approx 16 \text{ kHz}.$$

The only current needed is the reference current charging the capacitors. The comparing function of the thyristor is implicit to the circuit and is only related to the process Vth.

Figure 3:
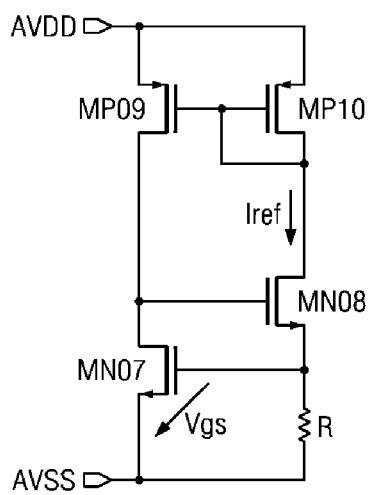
FIG. 3 is a reference current source for providing a reference current to a CMOS oscillator according to the invention.

With reference to FIG. 3, a preferred implementation of a reference current source is shown. An n-type MOS transistor MN07 has a source terminal connected to the voltage rail AVSS, and a gate connected to the source of another n-type MOS transistor MN08. A resistor having a resistance R is connected between the gate and the source of the transistor MN07, such that the gate-source voltage of the transistor MN07 is Vgs. The drain of the transistor MN07 is connected to the gate of the transistor MN08 and also to the drain of a p-type MOS transistor MP09. The drain of the transistor MN08 is connected to the drain of a p-type MOS transistor MP10 and also to the gates of both the transistor MP09 and the transistor MP10. The gates of the transistor MP09 and MP10 are interconnected and the sources of the transistors MP09 and MP10 are both connected to the voltage rail AVDD, forming a current mirror.

If Vgs is chosen such that Vgs=VTHN, the threshold voltage of the switching transistors MP01 and MP02, then the reference current supplied to the transistors MP01 and MP02, $I_{REF}$=VTHN/R. Thus, the reference current is proportional to the threshold voltage. When this value of reference current is substituted into the equation $$freq \cong \frac{I_{REF}}{V_{THN} \cdot 2C},$$

then VTHN is cancelled from the equation. Therefore any temperature and process variations can be compensated for and the oscillation frequency is stabilized.

Those skilled in the art to which the invention relates will appreciate that the described embodiments are merely representative of the many embodiments for implementation of the invention and that various additions, deletions, substitutions and other modifications may be made to the described examples, within the spirit and scope of the claimed invention.

What is claimed is:

1. An ultra low power CMOS oscillator for low frequency clock generation, comprising:

a reference current source;

first and second switch members coupled to the reference current source;

first and second thyristor-based inverters; and a first capacitor having an electrode coupled to receive a reference potential, and another electrode coupled to the first switch member, to the input of the first thyristor-based inverter, and to the output of the second thyristor-based inverter;

a second capacitor having an electrode coupled to receive a reference potential, and another electrode coupled to the second switch member, to the input of the second thyristor-based inverter, and to the output of the first thyristor-based inverters;

the circuit being configured and adapted to operate so that the first and second capacitors are alternatingly charged by the reference current source and discharged by the thyristor-based inverters.

2. The oscillator of claim 1, wherein each thyristor-based inverter comprises a pair of complementary MOS transistors; a first one of the MOS transistors having a gate coupled to the input of the inverter, a source coupled to a reference supply terminal, and a drain coupled to the output of the inverter; and a second one of the MOS transistors having a source coupled to a supply terminal, a drain coupled to the gate of the first MOS transistor, and a gate coupled to the output of the inverter.

3. The oscillator of claim 2, wherein each thyristor-based inverter is adapted and configured to be enabled or disabled by selectively connecting or disconnecting the drain of the second MOS transistor with or from the gate of the first MOS transistor and the gate of the second MOS transistor with or from the drain of the first MOS transistor, respectively.

4. The oscillator of claim 3, further comprising first and second chained inverters, the first chained inverter having an input coupled to the output of one of the thyristor-based inverters, and the second chained inverter having an input coupled to the output of the first chained inverter; the output of the first chained inverter being adapted and configured to provide a switch control signal to one of the first and second switch members and the output of the second chained inverter being adapted and configured to provide a switch control signal to the other of the first and second switch members.

5. The oscillator of claim 4, further comprising a first delay element having an input coupled to the output of the first chained inverter and an output coupled to provide an enabling signal to one of the first and second thyristor-based inverters; and a second delay element having an input coupled to the output of the second chained inverter and an output coupled to provide an enabling signal to the other one of the first and second thyristor-based inverters.

6. The oscillator of claim 5, wherein the reference current source is implemented with MOS transistors and provides a reference current proportional to the threshold voltage of the MOS transistors.

7. The oscillator of claim 1, further comprising first and second chained inverters, the first chained inverter having an input coupled to the output of one of the thyristor-based inverters, and the second chained inverter having an input coupled to the output of the first chained inverter; the output of the first chained inverter being adapted and configured to provide a switch control signal to one of the first and second switch members and the output of the second chained inverter being adapted and configured to provide a switch control signal to the other of the first and second switch members.

8. The oscillator of claim 7, further comprising a first delay element having an input coupled to the output of the first chained inverter and an output coupled to provide an enabling signal to one of the first and second thyristor-based inverters; and a second delay element having an input coupled to the output of the second chained inverter and an output coupled to provide an enabling signal to the other one of the first and second thyristor-based inverters.

9. The oscillator of claim 8, wherein the reference current source is implemented with MOS transistors and provides a reference current proportional to the threshold voltage of the MOS transistors.

10. The oscillator of claim 1, wherein the reference current source is implemented with MOS transistors and provides a reference current proportional to the threshold voltage of the MOS transistors.

* * * * *